(12) United States Patent
Meitl et al.

(10) Patent No.: US 9,343,363 B2
(45) Date of Patent: May 17, 2016

(54) THROUGH-SILICON VIAS AND INTERPOSERS FORMED BY METAL-CATALYZED WET ETCHING

(71) Applicant: Semprius, Inc., Durham, NC (US)

(72) Inventors: Matthew Meitl, Durham, NC (US); Christopher Bower, Raleigh, NC (US)

(73) Assignee: Semprius, Inc., Durham, NC (US)

( * ) Notice: Subject to any disclaimer, the term of this patent is extended or adjusted under 35 U.S.C. 154(b) by 0 days.

(21) Appl. No.: 14/213,046

(22) Filed: Mar. 14, 2014

(65) Prior Publication Data

US 2014/0264937 A1   Sep. 18, 2014

Related U.S. Application Data

(60) Provisional application No. 61/788,452, filed on Mar. 15, 2013.

(51) Int. Cl.
| | |
|---|---|
| H01L 21/302 | (2006.01) |
| H01L 21/768 | (2006.01) |
| H01L 23/498 | (2006.01) |
| H01L 23/14 | (2006.01) |
| H01L 21/306 | (2006.01) |
| H01L 21/308 | (2006.01) |

(52) U.S. Cl.
CPC ...... *H01L 21/76898* (2013.01); *H01L 21/3081* (2013.01); *H01L 21/30604* (2013.01); *H01L 23/147* (2013.01); *H01L 23/49827* (2013.01); *H01L 23/49838* (2013.01); *H01L 23/49872* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,298,459 A * | 3/1994 | Arikawa et al. | 438/614 |
| 5,886,389 A * | 3/1999 | Niwa | 257/401 |
| 6,762,134 B2 | 7/2004 | Bohn et al. | |
| 6,790,785 B1 | 9/2004 | Li et al. | |
| 2003/0024898 A1 | 2/2003 | Natsume et al. | |
| 2007/0298585 A1 | 12/2007 | Lubomirsky et al. | |
| 2010/0248449 A1 | 9/2010 | Hildreth et al. | |
| 2011/0165771 A1 | 7/2011 | Ring et al. | |
| 2011/0263119 A1 | 10/2011 | Li et al. | |
| 2011/0291153 A1* | 12/2011 | Yang et al. | 257/99 |
| 2011/0294255 A1 | 12/2011 | Lin et al. | |
| 2012/0074582 A1 | 3/2012 | Yu et al. | |
| 2013/0052762 A1 | 2/2013 | Li et al. | |
| 2013/0171413 A1* | 7/2013 | Khan et al. | 428/141 |

OTHER PUBLICATIONS

Chang et al. (2009) "Densely Packed Arrays of Ultra-High-Aspect-Ratio Silicon Nanowires Fabricated using Block-Copolymer Lithography and Metal-Assisted Etching," *Adv. Funct. Mater.* 19:2495-2500.

(Continued)

*Primary Examiner* — Reema Patel
(74) *Attorney, Agent, or Firm* — Lathrop & Gage LLP (57) ABSTRACT

Provided are methods for making a through-silicon via feature in a silicon substrate and related systems, such as by forming a noble metal structure on a silicon substrate support surface to generate silicon substrate contact regions that are in contact with or proximate to the noble metal structure; exposing at least a portion of the silicon substrate support surface and noble metal structure to an etchant to preferentially etch the silicon substrate contact regions compared to silicon substrate non-contact regions until the etch front reaches the silicon substrate bottom surface.

18 Claims, 8 Drawing Sheets

(56) References Cited

OTHER PUBLICATIONS

Cheng et al. (2008) "A Study of the Synthesis, Characterization, and Kinetics of Vertical Silicon Nanowire Arrays on (001)Si Substrates," *Journal of the Electrochemical Society*. 155(11):D711-D714.

Cruz et al. (2005) *Journal of the Electrochemical Society*. 152(6):C418-C424.

Huang et al. (2007) "Fabrication of Silicon Nanowire Arrays with Controlled Diameter, Length, and Density," *Adv. Mater*. 19:744-748.

Huang et al. (2010) "Oxidation Rate Effect on the Direction of Metal-Assisted Chemical and Electrochemical Etching of Silicon," *J. Phys. Chem. C*. 114(24):10683-10690.

Huang et al. (Sep. 21, 2010) "Metal-Assisted Chemical Etching of Silicon: A Review," *Adv. Mater*. 23:285-308.

International Search Report and Written Opinion corresponding to International Patent Application No. PCT/US2014/028599, mailed Jul. 25, 2014.

Li (Apr. 2012) "Metal Assisted Chemical Etching for High Aspect Ratio Nanostructures: A Review of Characteristics and Applications in Photovoltaics," *Current Opinion in Solid State and Materials Science*. 16:71-81.

Li et al. (2000) "Metal-assisted chemical etching in $HF/H_2O_2$ produces porous silicon," *Appl. Phys. Lett*. 77(16):2572.

Peng et al. (2008) "Motility of Metal Nanoparticles in Silicon and Induced Anisotropic Silicon Etching," *Adv. Funct. Mater*. 18:3026-3035.

* cited by examiner

THROUGH-SILICON VIAS AND INTERPOSERS FORMED BY METAL-CATALYZED WET ETCHING

CROSS-REFERENCE TO RELATED APPLICATIONS

This application claims the benefit of U.S. Provisional Application No. 61/788,452, filed Mar. 15, 2013, which is specifically incorporated by reference to the extent not inconsistent herewith.

BACKGROUND OF INVENTION

The field of the invention is wafer level packaging on silicon substrates. More specifically, the field of the invention is wafer level packaging that uses through-silicon vias. In a preferred embodiment, the field of the invention is wafer level packaging for the production of sub-receivers and receivers for concentrator photovoltaic modules.

Metal-assisted chemical etching is known in the art for forming nanostructures in silicon by highly anisotropic etching. Examples include US Pat. Pub. Nos. 2011/0263119, 2013/0052762; U.S. Pat. Nos. 6,762,134, 6,790,785; Huang et al. Adv. Mater. 2011, 23, 285-309; Peng et al. Adv. Funct. Mater. 2008, 18, 3026-3035; Appl. Phys. Lett. 77(16) (2000): 2572-2574. US Pat. Pub. No. 2011/0263119 describes forming nanoscale patterns in a porous semiconductor. That study, however, is limited in terms of length scales and fundamentally relates to porous materials. In contrast, the invention provided herein desirably avoids porosity. Provided herein is metal-catalyzed chemical etching to form structures in silicon that extend from a top surface of the substrate to the bottom surface of the substrate that are suitable for electrical interconnects in wafer level packaging. In particular, there is a need for processes that etch at least a thickness of the substrate to form submounts and interposers for a variety of applications.

SUMMARY OF THE INVENTION

Provided herein are silicon interposers with through-vias that have substantially vertical sidewalls. Preferably, the methods and systems provided herein relate to through-vias having minimal or no porosity in the through-via side walls. Provided are low cost methods of forming through-vias in silicon with vertical sidewalls. Provided are low cost interposers with reduced thermal resistance and reduced thermal expansion. Provided is a low cost method of forming electrically useful high aspect ratio through-vias in silicon.

In an embodiment, the invention is a method for making a through-silicon via feature in a silicon substrate such as by providing a silicon substrate having a support surface and a bottom surface separated from the support surface by a silicon substrate thickness. A noble metal structure is formed on the silicon substrate support surface to generate silicon substrate contact regions that are in contact with or proximate to the noble metal structure, and silicon substrate non-contact regions that are not in contact with or are not proximate to the noble metal structure. At least a portion of the silicon substrate support surface and noble metal structure is exposed to an etchant, wherein the etchant is an aqueous solution that comprises an oxidizing agent and an acid. The etchant preferentially etches the silicon substrate contact regions compared to silicon substrate non-contact regions, wherein the preferentially etching provides an etch front having an etch front rate and etch front direction, the etch front direction substantially normal to the silicon substrate support surface. The preferentially etching continues until the etch front reaches the silicon substrate bottom surface, thereby forming the through-silicon via by metal-catalyzed wet etching.

In an aspect, the exposing step comprises submerging at least a portion of the silicon substrate and noble metal structure into the etchant. In an aspect, the entire silicon substrate and noble metal structure is submerged into the etchant, such as by submerging in an etchant within an etch vessel.

In an embodiment, the etch front direction is substantially parallel to a gravitational force direction. This reflects a mechanism wherein the force due to gravity acts on the noble metal structure in a direction from the silicon top support surface toward the bottom surface, such as for a substrate on a flat surface normal to gravity resulting in the noble metal structure pulled in a straight-line direction from the support surface toward the bottom surface.

In any of the methods and systems provided herein, the noble metal structure that reaches the bottom surface, and any remnant silicon structures associated therewith, fall into an etch vessel, thereby removing the noble metal structure and remnant silicon structures from the silicon substrate thereby leaving behind one or more silicon through-vias without substantial noble metal associated therewith.

In an aspect, any of the methods provided herein further comprise exposing the through-silicon via to an aqueous acid mixture to remove any remnant noble metals from the silicon substrate. The aqueous acid mixture is optionally selected from the group consisting of: hydrochloric acid and nitric acid; and iodine and potassium iodide.

In an embodiment, the method further comprises the step of forming an electrically insulating layer on at least a portion of a surface of the silicon substrate and a wall of the through-silicon via, such as by a process selected from the group consisting of: thermal oxidation or chemical vapor deposition.

In an embodiment, any of the methods further relate to electrically isolating separate electrical nodes on the silicon substrate. In an aspect, this is accomplished by providing a plating base on at least a portion of the surface of the silicon substrate having a through-silicon via; depositing metal on at least a portion of a surface of the plating base; electrically isolating separate electrical nodes on the surfaces the silicon substrate by removing the plating base from the deposited metal and the silicon substrate, thereby forming a silicon interposer wafer-level package. In an aspect, the plating base comprises a metal selected from the group consisting of: copper, tungsten, titanium, palladium, platinum, and nickel; the plated metal structures comprises a metal selected from the group consisting of: copper, gold, silver, nickel, platinum; and the depositing metal step comprises electrodeposition of the metal on the surface of the plating base.

In an embodiment, any of the methods provided herein further comprising etching the silicon substrate and through vias with an isotropic etchant, thereby removing remnants of any silicon in the vias, wherein the isotropic etchant comprises mixtures of nitric acid and hydrofluoric acid; or nitric acid and ammonium fluoride. Such an isotropic etchant step improves a through-silicon via parameter, such as a through silicon via parameter selected from the group consisting of through-silicon via wall roughness and silicon remnant amount in the through-silicon vias. In an aspect, the improvement comprises an about at least 20%, about at least 50% or about at least 70% decrease in surface roughness. In an aspect, the improvement comprises an about at least 20%, about at least 50% or about at least 70% removal of silicon remnant mass in an individual through-silicon via.

In an aspect, any of the methods provided herein further process the silicon substrate and any associated vias. In an aspect, the method further comprises thermally oxidizing at least a portion of the silicon substrate and through-silicon vias thereby forming an oxide of silicon; and stripping the oxide of silicon using an aqueous solution that comprises hydrofluoric acid.

In an embodiment, the contact and non-contact region can be defined functionally. For example, a minimum etch front rate may be defined at a point furthest from any noble metal structures, or averaged over an area that is removed from the noble metal structures by a user-selected distance (e.g., more than 1 μm, more than 10 μm, or more than 100 μm). Then, a contact region may be functionally defined as any regions of the silicon substrate having an etch front rate that differs from the minimum etch front rate by a user selected amount. In one embodiment, the factor is defined as greater than 10, greater than 50, greater than 100, or greater than 500. In an aspect, the factor is 100, so that the contact region and preferential etching corresponds to a silicon substrate contact region maximum etch front rate that is at least 100-fold greater than a non-contact region minimum or average minimum etch front rate.

Any of the methods provided herein relate to a noble metal structure that comprises a plurality of noble metal structures formed on the silicon substrate support surface in a pattern. In this manner, there may be reliable and high-throughput via generation. The noble metal structures may be formed by a process selected from the group consisting of: evaporation deposition through a shadow mask; photolithography; metal deposition; and lift-off. In this manner, precise positioning and pattern generation, both within a noble metal structure and amongst noble metal structures and across the silicon support substrate as whole, is achieved. This allows for a pattern to correspond to desired positions and shapes of a plurality of through-silicon vias. In certain embodiments, the noble metal structures may be pre-formed and applied to the support surface in a desired pattern.

Noble metal structure is used broadly and may comprise a network of noble metal particles in a contiguous pattern, the noble metal particles having a diameter less than one micron.

In an aspect, the noble metal of the noble metal structure comprises a metal selected from the group consisting of: gold, platinum and silver. The noble metal structure may have a geometrical shape. For example, for generation of circular vias the noble metal structure may have an outer shape that is corresponding circular. The noble metal structure may be substantially two-dimensional, wherein the thickness is relatively thin, such as a disk or a ring. Alternatively, the noble metal structure may be three-dimensional, such as substantially spherical or spherical. One advantage of such a spherical shape is that the noble metal structure may still be precisely located on the silicon support substrate, but the added mass for the three-dimensional shape provides a larger resultant gravitational force to more reliably and quickly etch the vias.

In an embodiment, the plurality of noble metal structures are each substantially spherical, wherein each substantially spherical noble metal is confined to a position with a template structure having a plurality of recess features, with each recess feature confining a substantially spherical noble metal. In an aspect, the template structure is a photoresist. "Substantially spherical" refers to a generally spherical shape having a major and a minor axis that are within 20%, or within 10%, or within 5% of each other.

The substantially spherical noble metal structure may correspond to a solid noble metal throughout the structure. Alternatively, the structure may be a composite structure with an interior that is not a noble metal and a coating layer that is a noble metal. For example, the structure may be a polymer bead or a non-noble metal that is coated with a noble metal. The substantially spherical noble metal structure may, functionally, correspond to a solder ball having a surface compatible with the metal-catalyzed wet etching process provided herein.

In an aspect, the substantially spherical noble metal structure has an average diameter that is greater than or equal to 25 μm and less than or equal to 250 μm. Such relatively large size three-dimensionally shaped noble metal structures advantageously provide etching and associated through-vias with minimal or no porosity of the via sidewalls. Such porosity of the sidewalls is undesirable for the applications of the instant invention. In an aspect, the recess features of the template structure have a size so as to accommodate only a single sphere on the support substrate surface. In an aspect, the template structure recess feature was a characteristic width that is within 20%, within 10%, or within 5% of the average noble metal sphere diameter. Such a configuration facilitates placement of a single sphere at a desired etch location and corresponding desired through-silicon via.

Accordingly, an aspect of the instant invention relates to through-vias that have no substantial porosity. Such a sidewall is also referred herein as a smooth walled through-via to further contrast from porous walls.

An advantage to the instant methods and systems is the ability to more precisely control etch characteristics. For example, the etch front rate or etch front direction may be controlled by selecting a geometrical shape and pattern of the noble metal structure. Specific examples of various geometrical shapes and patterns are provided in FIG. 4. In an embodiment, the geometrical shape and pattern comprises a substantially circular outer limit and a spatially-varying pattern of noble metal particles within an interior region defined by the substantially circular outer limit. As desired, the outer limit may have other shapes than circular, including regular geometrical shapes such as rectangles, squares, lines, ellipses, or irregular non-geometrical shapes.

Examples of patterns within the outer limit include a solid fill, such as a disk or a spatially-varying pattern that corresponds to a grid, a ring, or a plurality of lines or curves extending from an origin.

The methods and systems provided herein are useful in making through-silicon vias or recess features having a characteristic opening size that is microsized, such as greater than or equal to 25 μm, or that is greater than or equal to 25 μm and less than or equal to 500 μm. The methods and systems are compatible with making a plurality of through-silicon vias having any desired density, such as a plurality of through-silicon vias with a through-silicon via density that is between about 0.1 $mm^{-2}$ and 1000 $mm^{-2}$.

In an embodiment, the etchant aqueous solution comprises a mixture of hydrogen peroxide and hydrofluoric acid.

In an embodiment, the silicon substrate is selected from the group consisting of: monocrystalline silicon; solar grade silicon; multi-crystalline silicon; and poly-crystalline silicon. In an aspect, the silicon substrate is electrically conductive silicon, such as by use of doped silicon, and the vias may be filled with a dielectric instead of an electrically-conductive material.

Any of the methods provided herein may be used to make a wafer-level silicon interposer package. In an aspect, any of the methods may further comprise exposing the through-silicon via to an aqueous acid mixture to remove any remnant noble metals from the silicon substrate and electrically insulating at least a portion of the silicon substrate and a wall of the through-silicon via. In an aspect, the silicon substrate may be connected to a cathode configured for electroplating, wherein the cathode comprises a titanium layer having a plating base surface and electrically insulating spacer features. Examples of insulating spacer features include a dielectric material that is provided on a surface of the silicon substrate. Alternatively, the spacer features include a dielectric material provided on a surface of the cathode to provide physical spacing between the cathode and the bottom surface of the silicon substrate. Specific examples of insulating spacer features include electrically insulating materials that extend a certain height past the silicon surface. The dielectric material may partially coat or conformally contact an exposed silicon surface, such as the bottom surface, so as to provide subsequent deposition of metal that laterally wraps around corners or edges of the silicon through-vias. In this manner, the deposited metal within a via is better physically secured to the silicon substrate.

In an embodiment, the method further comprises plating a metal on a plating base surface, such as by at least partially filling the through-silicon via with the metal. In an aspect, the plating comprises laterally wrapping a portion of the silicon substrate support surface with the metal, thereby better securing the deposited metal and increasing the available surface area for electrical contact.

The method may further comprise the step of separating the cathode or base plate from the silicon substrate, wherein the plated metal that at least partially fills the through-silicon via remains in the through-silicon via. Electrically insulating spacer features may be removed with the cathode or base plate or may remain behind.

In another embodiment, provided herein are any of the above methods, except the etching is stopped short of reaching the silicon substrate bottom surface. In an aspect, the method is described as a method for making a recess feature in a silicon substrate by: providing a silicon substrate having a support surface and a bottom surface separated from the support surface by a silicon substrate thickness; forming a noble metal structure on the silicon substrate support surface to generate silicon substrate contact regions that are in contact with or proximate to the noble metal structure, and silicon substrate non-contact regions that are not in contact with or are not proximate to the noble metal structure; exposing at least a portion of the silicon substrate support surface and noble metal structure to an etchant, wherein the etchant is an aqueous solution that comprises an oxidizing agent and an acid; preferentially etching with the etchant the silicon substrate contact regions compared to silicon substrate non-contact regions, wherein the preferentially etching provides an etch front having an etch front rate and etch front direction, the etch front direction substantially normal to the silicon substrate support surface; and continuing the preferentially etching step until the etch front reaches an etch depth in the silicon substrate, wherein the etch depth is less than a thickness of the silicon substrate; thereby forming the recess feature by metal-catalyzed wet etching.

In an aspect, the silicon substrate comprises electrically-conductive silicon and the etch depth is greater than or equal to 100 µm. In an aspect, about 50%, about 75% or about 90% of the thickness of the electrically-conductive silicon substrate is etched. In an aspect, the thickness of the silicon substrate is selected from a range that is greater than or equal to 100 µm and less than or equal to 2 mm.

Any of the methods for forming recess features may further comprise arresting the etch front rate by removing the etchant before the etch front reaches the bottom surface.

Any of the methods for forming a recess feature may further comprise filling the recess feature with a dielectric material. For example, the dielectric material may be applied as a liquid to fill the recess feature and conformally coat the silicon substrate top surface, and the liquid dielectric subsequently cured to form a solid dielectric. Examples of dielectric material include: benzocyclobutene; polyimide; epoxy; polybenzoxazole; spin-on glass; thermal silicon oxide; or a combination thereof.

In an embodiment, the dielectric is applied by two or more of: thermal oxidization to form silicon oxide; chemical vapor deposition; and application of a liquid precursor that is cured after application to form a solid dielectric.

In an aspect, the method further comprises: removing a portion of the silicon substrate bottom surface and noble metal in the recess feature to expose a bottom surface of dielectric in the recess feature; and removing at least a portion of the dielectric that covers the silicon substrate support surface to expose a top surface of the silicon substrate; thereby forming through-silicon vias filled with dielectric. In this manner, the dielectric electrically isolates structures of conductive silicon from adjacent structures of conductive silicon. In contrast to the metal filled vias described herein, the electrical nodes in this aspect correspond to portions of conductive silicon separated by dielectric-filled vias. Accordingly, any of the recess feature generation, in an end result, may relate to a via that transits from a top surface to a bottom surface of an end-processed silicon substrate.

Also provided herein are methods of making a wafer-level silicon interposer package by any of the methods described herein. For example, the method may further comprise the steps of: removing any remnant noble metals from the silicon substrate with an aqueous acid mixture; forming an electrically insulating layer on at least a portion of exposed surfaces of the silicon substrate and the through-silicon via; and at least partially filling the through-silicon via with a metal.

Additional method steps may include: etching the silicon substrate and through-silicon vias with an isotropic etchant, thereby removing remnants of any silicon in the vias; thermally oxidizing at least a portion of the silicon substrate and through-silicon vias thereby forming an oxide of silicon; and stripping said oxide of silicon using an aqueous solution that comprises hydrofluoric acid, thereby improving a through-silicon via parameter, the through silicon via parameter selected from the group consisting of through-silicon via wall roughness and silicon remnant amount in the through-silicon vias. To add metals to the vias, any of the methods may further comprise: providing a plating base on at least a portion of the surfaces of the silicon substrate and through-silicon vias; plating metal on at least a portion of the plating base; and electrically isolating separate electrical nodes on the surfaces the silicon substrate. The plating base may comprises a cathode, the method further comprising the steps of contacting the silicon substrate to the cathode configured for electroplating, wherein the cathode comprises a titanium layer having a plating base surface and electrically insulating spacers; electroplating metal on the plating base surface to at least partially fill the silicon via; and separating the cathode from the silicon substrate and the electroplated metal.

In an embodiment, any of the methods or systems may use a silicon substrate that is a monocrystalline substrate and the silicon support surface is oriented parallel to the (1 0 0) crystal plane. In an aspect, the silicon substrate is selected from the group consisting of solar grade silicon; multi-crystalline silicon; and poly-crystalline silicon. In an aspect, the support surface is formed by the process of wafering by wire-saw cutting. In an aspect, the silicon support surface is polished.

Any of the through-silicon vias or recess features may have a characteristic opening dimension greater than or equal to 25 μm. Characteristic opening dimension may refer to an average diameter, width, length, or an effective diameter calculated for a circle having an equivalent area to the cross-sectional are of the silicon via or recess features. Any of the through-silicon vias or recess features have substantially vertical wall surfaces, as provided by etching under a gravitational force that is normal to the silicon substrate support and bottom surfaces.

In an aspect, the noble metal structures are distributed in a pattern on the support surface and correspond to desired positions and shapes of the to-be-made through-silicon vias. Accordingly, for an array of desired through-silicon vias, a corresponding array of noble metal structures are provided on the silicon substrate surface.

Also provided herein are wafer-level silicon interposer packages. The package may comprise: a silicon substrate having a top surface, a bottom surface, and a thickness that separates the top surface from the bottom surface; a plurality of through-silicon vias that traverse from the silicon substrate top surface to the bottom surface, wherein the through-silicon vias are made by metal-catalyzed wet etching; an insulating layer that coats the silicon substrate and the through-vias; electroplated metal that fills the through-silicon vias and laterally extends from the through silicon vias to cover at least a portion of the insulating layer that coats the silicon substrate top surface and the bottom surface; and wherein each through-silicon via is electrically isolated from other through-silicon vias.

The through silicon via may have an opening size selected from a range that is greater than or equal to 25 μm and less than or equal to an upper limit, such as 1 mm. The silicon substrate may have a thickness that is greater than or equal to 50 μm and less than or equal to 2 mm. The electroplated metal may comprise a metal selected from the group consisting of copper, gold, silver, nickel, platinum.

Any of the wafer-level silicon interposer packages may be made by any of the methods described herein.

In an aspect, any of the methods and wafer-level silicon interposer packages provided herein may be used in an application selected from the group consisting of: a submount for opto-electric devices, such as photovoltaics; light emitting diodes; passive components including capacitors, resistors, inductors and/or diodes; integrated circuits, for example power management or signal processing devices.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 1(a)-(e). An illustration of a process of forming through-silicon vias according to one embodiment of the present invention.

FIG. 2(a)-(e). An illustration of a process of forming metalized silicon interposers according to one embodiment of the present invention.

FIG. 3(a)-(j). An illustration of a process of forming metalized silicon interposers with filled holes according to one embodiment of the present invention.

FIG. 6(a)-(f). An illustration of a process of forming through-silicon vias using noble metal beads according to one embodiment of the present invention.

FIG. 7(a)-(e). An illustration of a process of forming through-silicon vias using a conductive silicon substrate according to one embodiment of the present invention.

DETAILED DESCRIPTION OF THE INVENTION

In general, the terms and phrases used herein have their art-recognized meaning, which can be found by reference to standard texts, journal references and contexts known to those skilled in the art. The following definitions are provided to clarify their specific use in the context of the invention.

"Noble metal structure" refers broadly to a noble metal that is provided on a top surface of the silicon substrate, such as a support surface. The outer shape of the structure corresponds to the shape of the through-via or recess feature that will be etched. The structure may be formed on the surface by any method known in the art, including by deposition, chemical vapor deposition, shadow mask deposition, photolithography, electrodeposition, lift-off or other transfer process. Alternatively, the structure may be preformed and transferred to the support surface, such as by a transfer printing process or selected deposition. For example, the noble metal structure may comprises a plurality of beads, balls or spheres that are applied to the support surface, wherein a template structure having recess features holds an individual bead, ball or sphere in place for etching.

The relative spatial positioning between noble metal structures and regions of the silicon that etch quickly due to the contact with or close proximity to the noble metal structures and the regions of non-contact or not in proximity has some tolerance and variability. The terms are used to provide a functional distinction between regions that undergo preferential etching or faster etching than other regions. As discussed, the regions are readily determined and defined by observing etch conditions, with certain regions that etch much faster than other regions. With this observation, the "in contact with or proximate to" and "non-contact that are not proximate to" regions are readily determined. Generally, the contact regions include those substrate areas that are immediately below the noble metal structure and the non-contact regions include those substrate areas that are between adjacent noble metal structures. The methods provide a plurality of noble metal structures on the surface of a silicon substrate, each structure having a shape and a position on at least one surface of the substrate, and the positions and cross sections of etched vias are substantially defined by the projection of the plurality of noble metal structures onto the surface of the substrate. "Preferentially etching" accordingly refers to etching that occurs in the silicon that is in contact and proximate to the substrate as characterized by a significantly higher etch rate than the etch rates for the non-contact regions far from the noble metal structure.

"Through-silicon via parameter" refers to a quantifiable parameter that describes the quality of the via. Examples include surface roughness, verticality of the via sidewalls, unwanted remnants in the via, including silicon remnants or noble metal remnants, sidewall shape and uniformity. In an aspect, the improvement of the through-silicon via parameter may be described as a percent improvement relative to the parameter before an improvement step, such as an isotropic etch step. The percent improvement may be described as a 20% improvement, 40% improvement or 50% or better improvement.

A "pattern" of noble metal structures, depending on the context, may refer to a supra-level pattern, wherein the plurality of structures form a pattern, such as an ordered array having defined spacing. In another context, the pattern may refer to the shape or pattern of individual metal structures, such as individual metal structures within an array of metal structures. This is exemplified in FIG. 4, where 20 unique pattern embodiments are illustrated for an individual metal structure. Such patterns are useful in further controlling etch rates and shapes.

Unless defined otherwise, the term "substantially" is used to refer to a deviation from a desired value that is less than about 20%, less than about 10%, or that about corresponds to the desired value.

Figure 1:
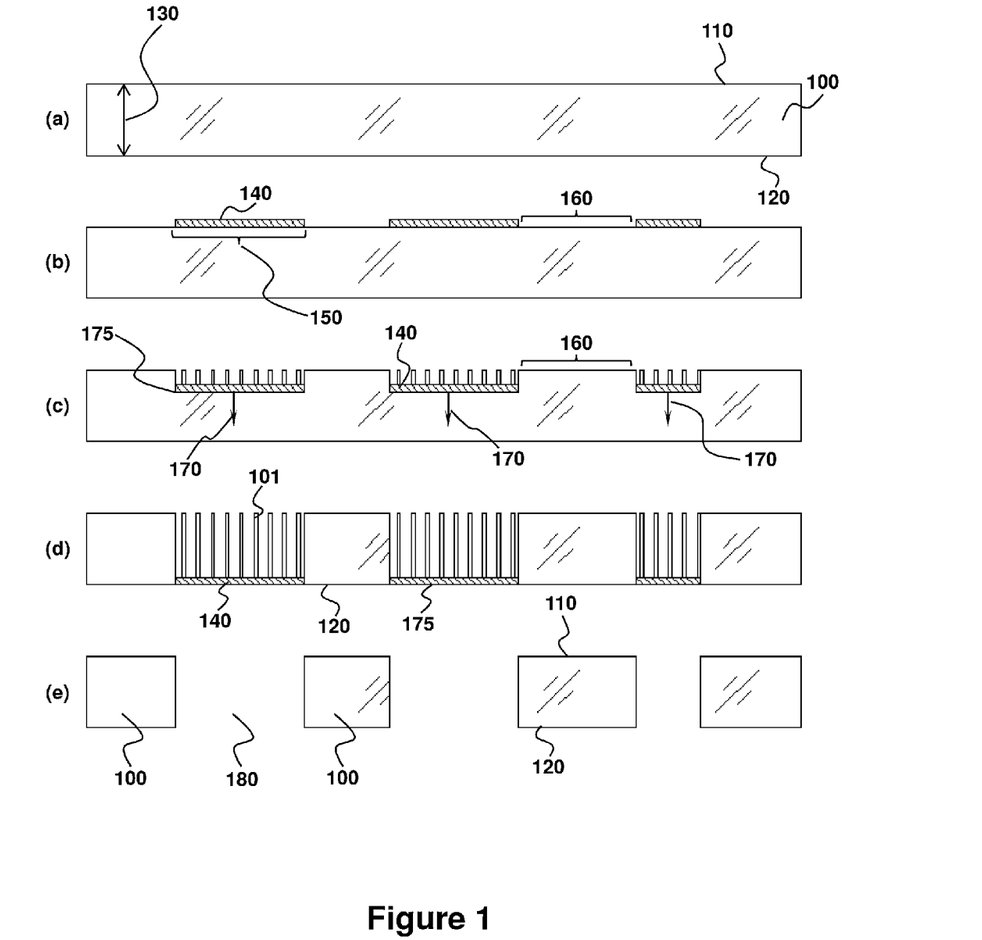

FIG. 1 illustrates a one embodiment of the present invention. FIG. 1(a) shows a silicon substrate 100 having a support surface 110 a bottom surface 120 and a thickness as illustrated by arrow 130. FIG. 1(b) shows noble metal structures 140 formed on a support surface of the substrate, e.g. by physical vapor deposition, along with contract regions 150 and non-contact regions 160. FIG. 1(c) shows the etching of the silicon substrate, e.g. by an aqueous mixture of hydrofluoric acid and hydrogen peroxide, substantially normal to the first surface in the regions of the substrate that are in contact with or in close proximity to the noble metal structures. Etch front 175 has a direction and rate, as indicated by arrows 170. Regions of the substrate 160 that are not in direct contact with or in close proximity to the noble metal structures are etched to a much lesser extent or not at all. Remnant structures 101 of silicon can persist in the etched regions according to the mechanisms of metal assisted chemical etching. FIG. 1(d) shows the progression of noble metal structure 140 and corresponding etch front 175 to the bottom surface 120 of the silicon, thereby forming through-substrate vias 170 that traverse the substrate thickness from top or support surface 110 to bottom surface 120. When the etch front reaches the bottom surface, the noble metal structures and any remnant silicon structures of the vias fall into the etch vessel, redistribute within the through-silicon via, or some combination thereof. Optional exposure to mixtures of hydrochloric and nitric acids can then dissolve noble metal structures that adhere to the substrate. Optional isotropic etches of silicon can remove any remnant silicon structures from the through-silicon vias and increase the smoothness and cleanliness of the surfaces of the through-silicon vias. The isotropic etches of silicon can also complete the formation of the through-silicon via if the anisotropic metal catalyzed etch is halted before reaching the second surface. Optional thermal oxidation of the silicon followed by stripping the resulting oxide of silicon in a solution that contains hydrofluoric acid can also remove any remnant silicon structures from the through-silicon vias and increase the smoothness and cleanliness of the surfaces of the through-silicon vias.

Figure 2:
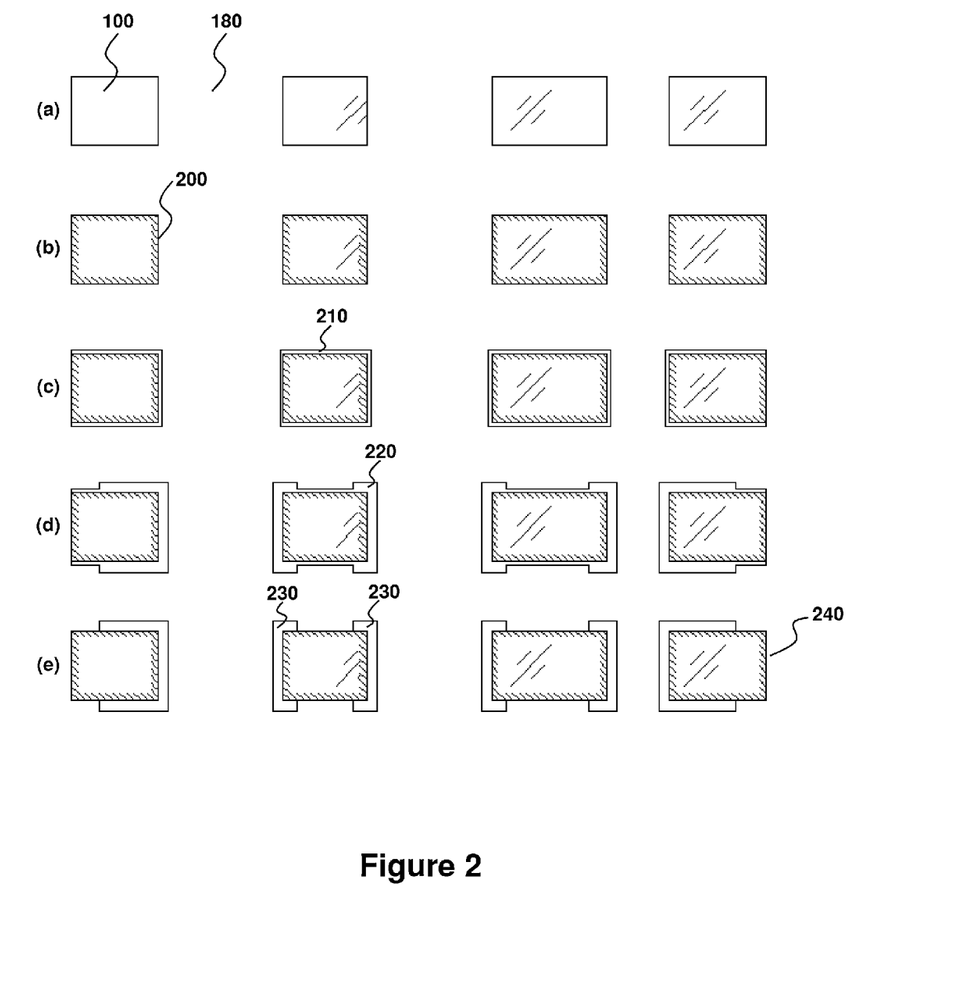

FIG. 2 illustrates a method of making a silicon interposer according to one embodiment of the present invention. The method includes the concepts of FIG. 1 to generate clean, smooth and suitably wide through-silicon vias, with FIG. 2(a) corresponding to FIG. 1(e). Suitably wide refers to a diameter of the via that allows facile formation of insulating layers and conducting layers according to the processes described herein. Suitably wide dimensions depend on the thickness of the silicon substrate, but for typical silicon substrates that are 100 to 1000 microns thick, 25 to 200 micron diameter vias are suitably wide. Thinner substrates allow facile formation of insulating and conductive layers in vias that are less wide, and thicker substrates may require wider vias in some applications. FIG. 2(b) shows the formation of an insulating layer 200 on the surfaces of the silicon substrate and the through-silicon vias, e.g. by thermal oxidation. FIG. 2(c) shows the formation of a plating base 210 on at least a portion of the surfaces of the silicon substrate and the through-silicon vias. FIG. 2(d) shows plated metal 220 deposited on top of some portions of the plating base, e.g. by electroplating through a photoresist template followed by removal of the photoresist template. FIG. 2(e) shows the removal of regions of the plating base that are not coated by the plated metal, thereby forming a silicon interposer wafer-level package 240 that includes through substrate vias formed by metal catalyzed wet etching and electrical nodes 230 that are in electrical isolation from other nodes.

Figure 3:
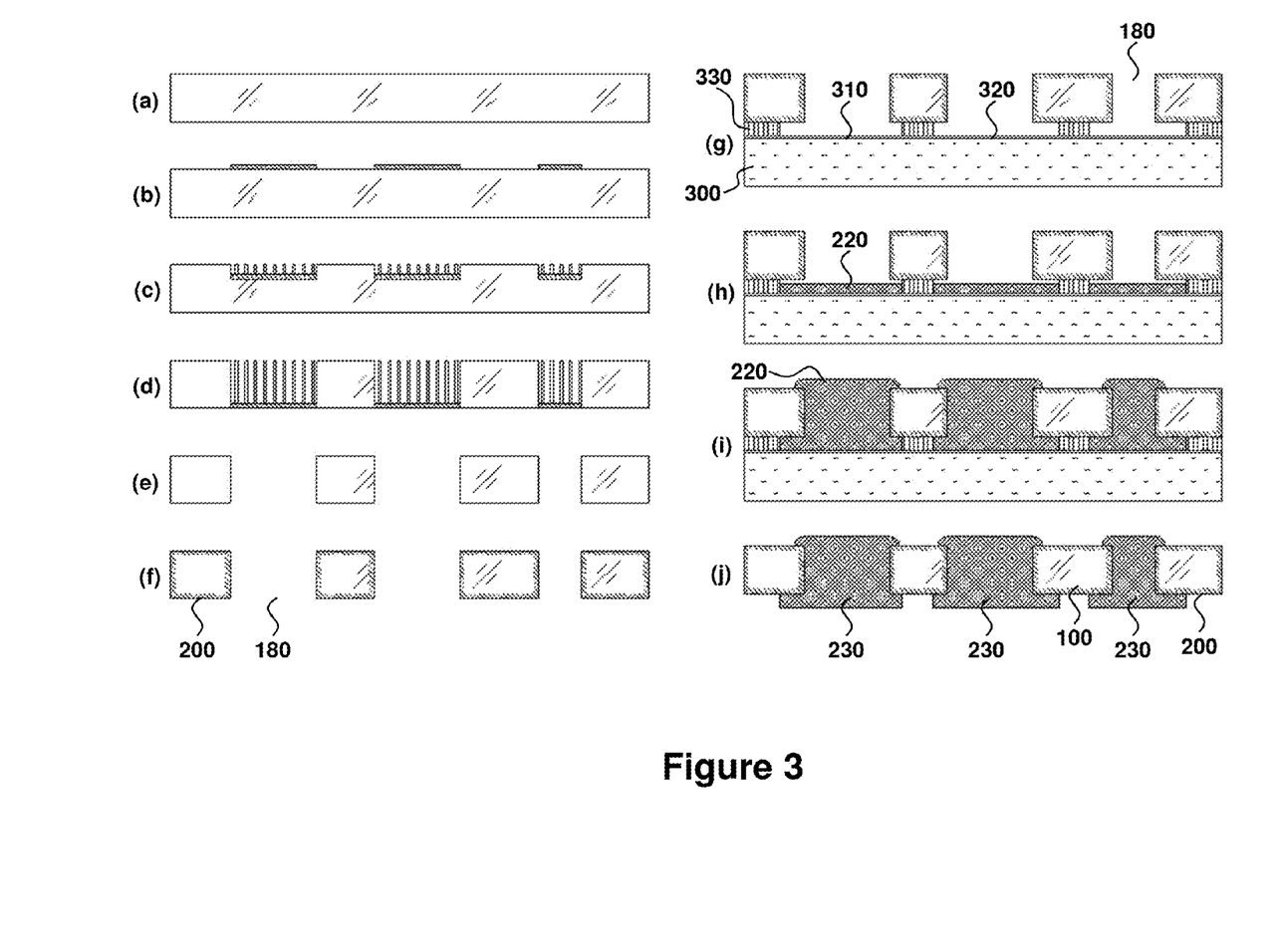

FIG. 3 illustrates a method of making a silicon interposer with filled vias according to one embodiment of the present invention. The method includes the concepts of FIG. 1 to generate clean, smooth and suitably wide through-silicon vias, as shown in FIGS. 3(a)-(e). FIG. 3(f) shows thermal oxidation 200 of the surfaces of the silicon substrate and the through-silicon vias 180.

In FIG. 3(g), the silicon substrate contacts a plating electrode 300, such as a cathode that includes an exposed layer of titanium 310 having a base surface 320 and optionally electrically insulating spacer features 330. The spacer and titanium layer are selected to adhere weakly to plated metal films 220 that are deposited on or against them. The spacer features serve to prevent deposition of plated metals 220 on desired portions of the substrate. FIG. 3(h) shows electroplating of metals 220 on the cathode 300 proceeding from the surface 320 of the titanium 310. Said electroplating continues in FIG. 3(i) to fill the through-silicon vias and optionally form some lateral wrap around plated metal structures on the surface of the silicon substrate opposite the cathode. In FIG. 3(j) the cathode separates from the silicon substrate 100. Upon separation, the titanium layer and electrically insulating spacer features remain in contact with the cathode, and the plated metal 220 remains in the through-silicon vias to form electrical nodes 230 electrically isolated from adjacent nodes by the silicon substrate 100. In an aspect, a top and bottom surface of the metal 220 extend beyond the top surface and the bottom surface, so that the thickness of the deposited metal is greater than the thickness of the silicon substrate.

FIGS. 1-3 schematically illustrate various embodiments of the invention, including: providing a silicon substrate, forming noble metal structures on a first surface of the silicon substrate, submerging at least a portion of the silicon substrates and noble metal structures into an aqueous solution that includes an oxidizing agent and an acid such that regions of the silicon in close proximity to or in contact with the noble metal structures are etched substantially faster than the regions of the silicon that are not in contact with or in close proximity to the noble metal structures; continuing to etch the regions of the silicon that are in contact with the noble metal structures such that the etch front progresses substantially normal to the plane of the first surface of the silicon substrate until the etch front reaches the second surface of the silicon substrate, thereby forming through-silicon vias; etching the silicon with an isotropic etch, thereby removing remnants of silicon in the vias left by the metal-catalyzed etching, thereby improving the smoothness and cleanliness of the through-silicon vias.

In another embodiment, FIGS. 1-3 schematically illustrate provides a method of forming a silicon interposer that includes: providing a silicon substrate; forming noble metal structures on a first surface of the silicon substrate; submerging at least a portion of the silicon substrates and noble metal structures into an aqueous solution that includes an oxidizing agent and an acid such that regions of the silicon in contact with or close proximity to the noble metal structures are etched substantially faster than the regions of the silicon that are not in contact with or in close proximity to the noble metal structures; continuing to etch the regions of the silicon that are in contact with the noble metal structures such that the etch front progresses substantially normal to the plane of the first surface of the silicon substrate until the etch front reaches the second surface of the silicon substrate, thereby forming through-silicon vias; using an aqueous acid mixture (e.g. hydrochloric acid and nitric acid) to remove noble metals from the silicon substrate; forming an electrically insulating layer (e.g. by thermal oxidation or chemical vapor deposition) on at least a portion of the surfaces of the silicon substrate and the through-silicon vias.

In certain embodiments, the method further includes providing metal plating base layer on at least a portion of the surface of the silicon substrate and the through-silicon vias. In some embodiments, the method further includes plating metal on at least a portion of the metal plating base layer. In some embodiments, the metal plating base layer includes copper, tungsten, or titanium. In some embodiments, the plating metal is copper, gold, or silver. In some embodiments, the plating base is formed by sputtering, by electroless deposition of a metal.

In some embodiments, the plating metal includes nickel, or platinum. In some embodiments, the plating base includes palladium, platinum, or nickel. In some embodiments, at least a portion of the plating base is etched away to isolate separate electrical nodes on the interposer. In some embodiments, the noble metal structures that catalyze the through-silicon etching include gold, platinum or silver. In some embodiments, the noble metal structures include a network of noble metal particles with the particles having diameters less than one micron. In some embodiments, the noble metal structures are formed by evaporation of the noble metal through a shadow mask.

In some embodiments, the silicon substrate is a single-crystal, the first surface of the silicon wafer is substantially parallel to the (1 0 0) crystal plane, and the etching front travels substantially normal to the (1 0 0) crystal plane. In some embodiments, the silicon substrate includes multiple crystals. In some embodiments, the silicon substrate includes multiple crystals that have substantially different orientations. In some embodiments, the silicon substrate is solar grade silicon.

In some embodiments, at least one surface of the silicon substrate is unpolished, or at least one surface of the silicon substrate is polished. In some embodiments, at least one surface of the silicon substrate is formed by wire cutting. In some embodiments, the method is substantially independent of the surface quality of the silicon substrate.

In another embodiment, the invention provides a method of forming a silicon interposer that includes: providing a silicon substrate; forming noble metal structures on a first surface of the silicon substrate; submerging at least a portion of the silicon substrates and noble metal structures into an aqueous solution that includes an oxidizing agent and an acid such that regions of the silicon in contact with or close proximity to the noble metal structures are etched substantially faster than the regions of the silicon that are not in contact with or close proximity to the noble metal structures; continuing to etch the regions of the silicon that are in contact with the noble metal structures such that the etch front progresses substantially normal to the plane of the first surface of the silicon substrate until the etch front reaches the second surface of the silicon substrate, thereby forming through-silicon vias; oxidizing at least a portion of the surfaces of the silicon substrate and the through-silicon vias by thermal oxidation and subsequently stripping the resulting oxide of silicon by wet treatment in an aqueous solution that includes hydrofluoric acid, thereby improving the smoothness and cleanliness of the through-silicon vias.

Figure 4:
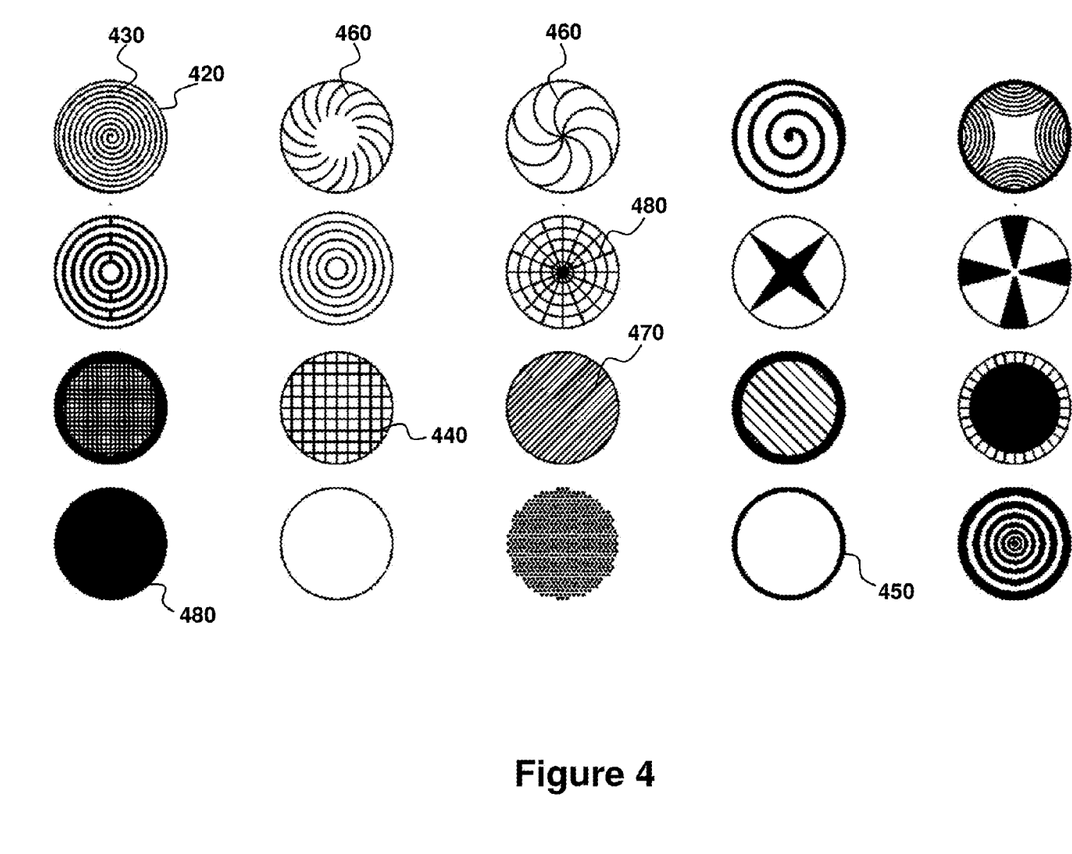
FIG. 4. Different designs of planar noble metal structures that can be used to form generally circular vias in a silicon substrate to form an interposer of the present invention. The design is selected to control the direction or rate of the etch.

FIG. 4 illustrates noble metal structures having various geometrical shapes and patterns. Different designs of planar noble metal structures can be used to form generally circular vias in a silicon substrate to form an interposer of the present invention. The design may be selected to control the direction or rate of the etch. The noble metal structure has a substantially circular outer limit 420 that confines an interior region 430. Within the interior region, the noble metal may have a spatially varying pattern or may be solid 480 corresponding to a disk. Examples of spatially varying patterns include a grid 440, a ring 450, a plurality of curves 460 or lines 470, or a combination thereof 480.

Figure 5:
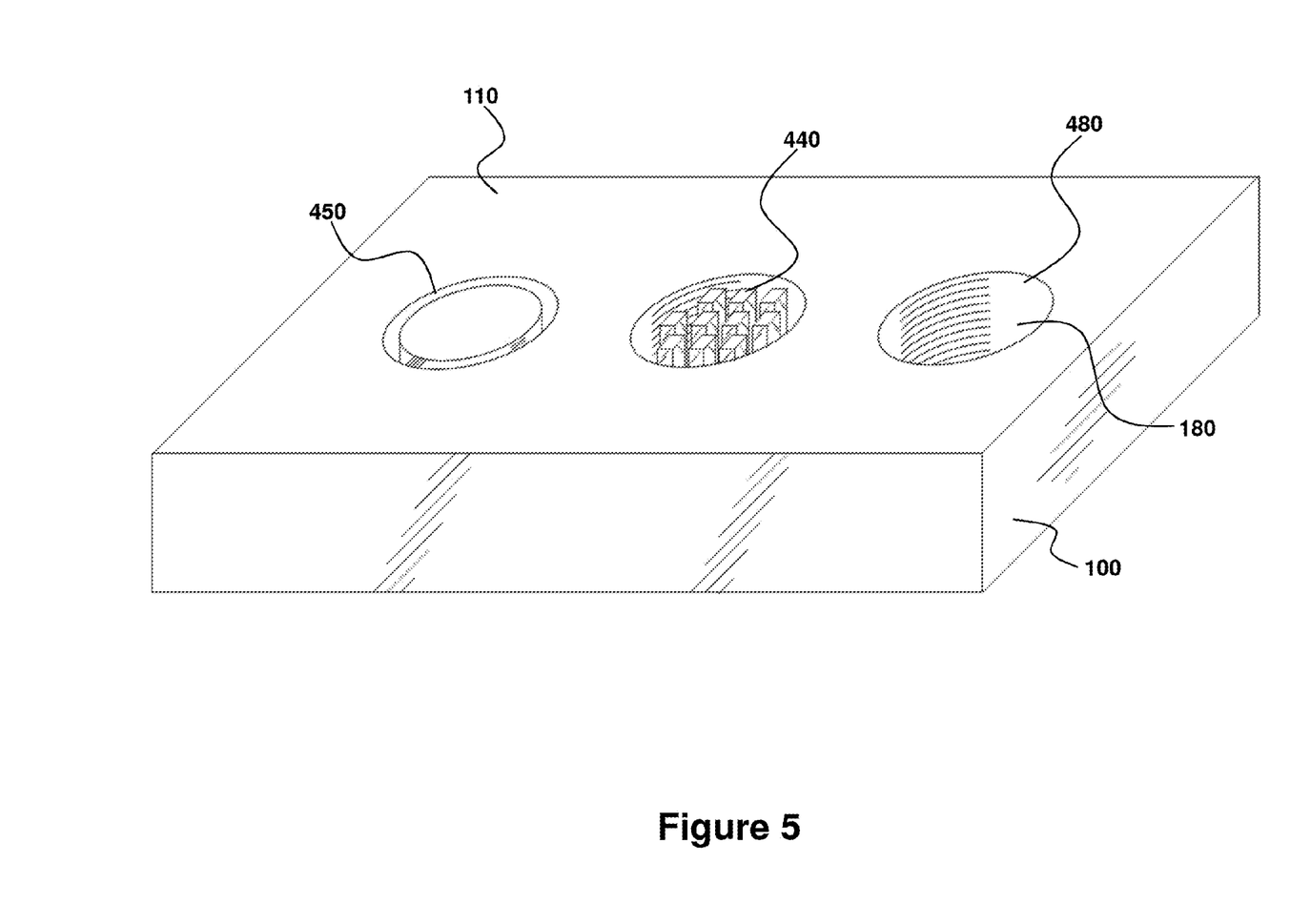
FIG. 5. An illustration of partially formed vias in silicon substrates etched by different designs of noble metal structures of the present invention. In the left design, the noble metal structure is ring-shaped and the etching process produces a slug of silicon during via formation. In the center design, the noble metal structure is grid shaped and the etching process produces silicon beam structures during via formation. In the design on the right, the noble metal structure is disk-shaped and the etch produces an empty via during via formation.

FIG. 5 illustrates a pattern of noble metal structures that etches silicon substrate 100 from a support surface 110. In this example the pattern is a simple line of three noble metal structures, each having a unique individual pattern as indicated by the different geometry (ring 450; grid 440; and substantially cylindrical from disk 480, from left to right, respectively) of the etch holes 180 through the silicon substrate 100. Partially formed vias are illustrated in silicon substrates etched by different designs/patterns of noble metal structures illustrated in FIG. 4. In the left design, the noble metal structure is ring-shaped 450 and the etching process produces a slug of silicon during via formation. In the center design, the noble metal structure is grid shaped 440 and the etching process produces silicon beam structures during via formation. In the design on the right, the noble metal structure is disk-shaped 480 and the etch processes produces an empty via during via formation.

Figure 6:
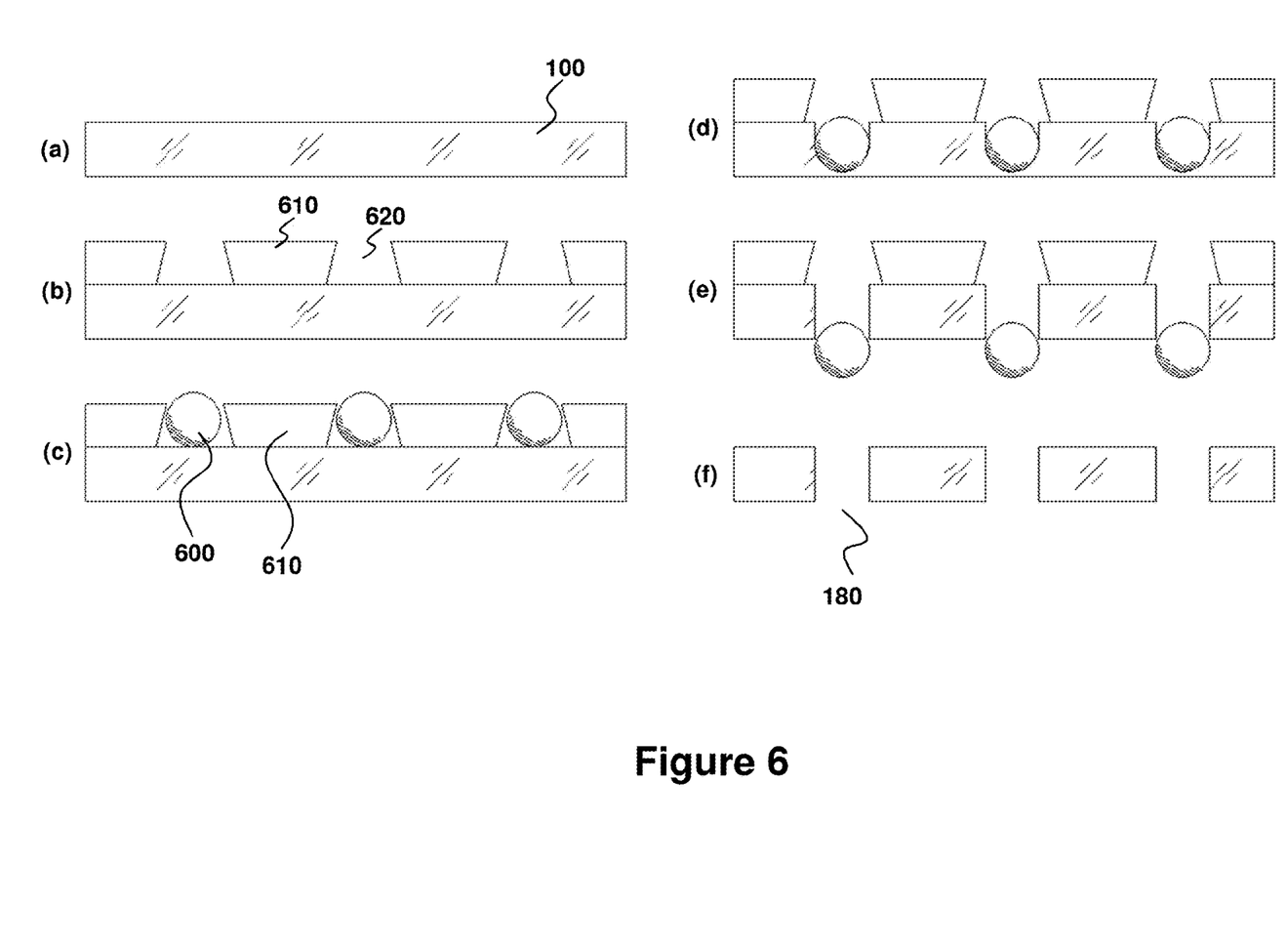

FIG. 6 illustrates another embodiment using highly three-dimensional noble metal structures. FIG. 6(*a*) shows a silicon substrate 100. FIG. 6(*b*) shows template structures 610 formed on a first surface of the substrate, e.g. through the use of a photoresist material, especially a dry film photoresist material. FIG. 6(*c*) shows noble metal structures placed in the recess features 620 of the template structures. The recess features may be geometrically sized and configured so as to facilitate placement of single three-dimensional noble metal structure in a single recess feature. In this example, the recess feature has angled walls with one dimension that approaches the diameter of the sphere. In this illustration, the noble metal structures are beads 600 which are substantially spherical to facilitate placement of one bead per one template structure recess feature. In this configuration, other three-dimensional shapes may be used. "Three-dimensional" refers to highly three-dimensional structures wherein a height of the structure approaches another characteristic dimension of the structure, such as a width or length. In contrast, two-dimensional metal structures 140 (see FIG. 1) are more accurately described as layers, thin films, or coatings, because their thickness is so much less than the width or length). The beads in this illustration have a surface composition that includes one or more noble metals. The core of the beads may include other materials that are not noble metals, for example copper. FIG. 6(*d*) shows the etching of the silicon substrate, e.g. by an aqueous mixture of hydrofluoric acid and hydrogen peroxide, substantially normal to the first surface in the regions of the substrate that are in contact with or in close proximity to the noble metal structures. Note that the regions of the substrate that are not in direct contact with or in close proximity to the noble metal structures are etched to a much lesser extent or not at all. In this embodiment of the present invention, the force of gravity guides the etch direction and ensures highly uniform and straight side walls. FIG. 6(*e*) shows the progression of the etch to the second or bottom surface of the silicon, thereby forming through-substrate vias 180. When the etch front reaches the bottom surface, the noble metal structures fall into the etch vessel. Optionally, apparatus to capture the noble metal structures after the completion of the etch may be used.

Figure 7:
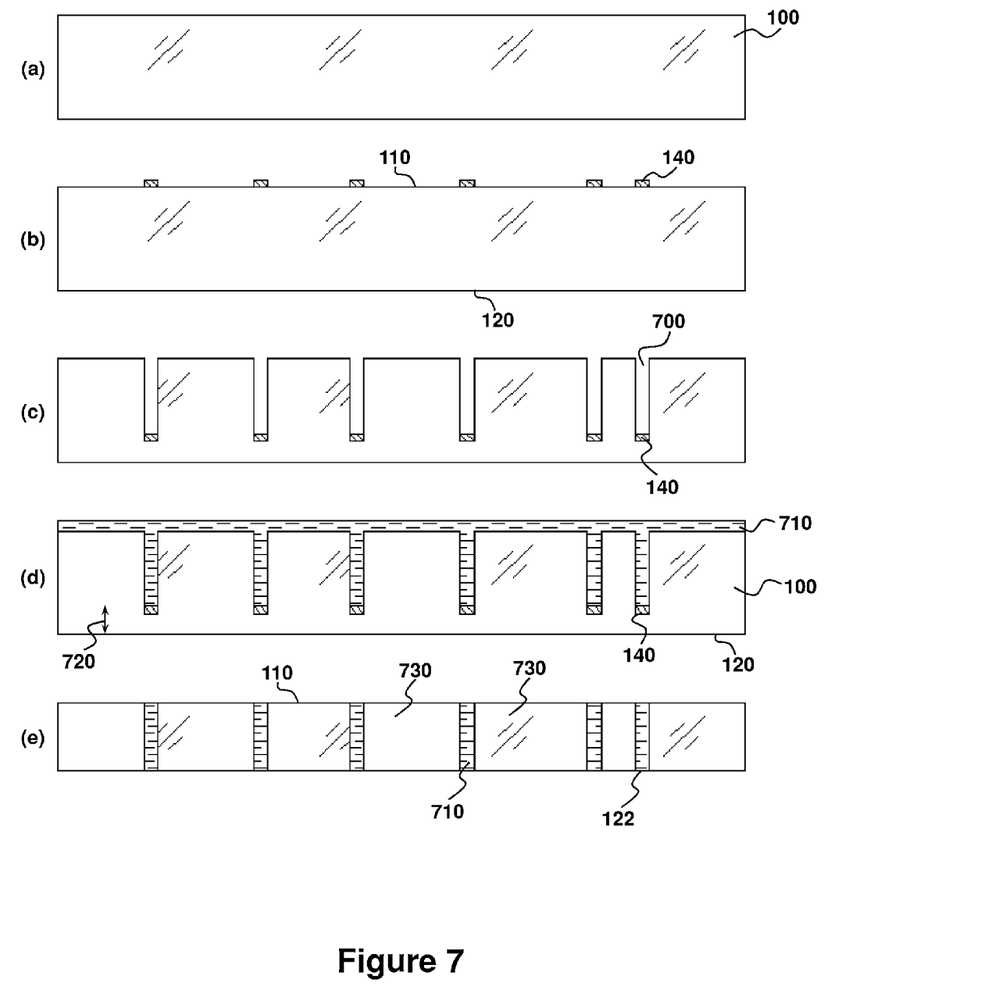

FIG. 7 illustrates yet another embodiment of the present invention in which metal assisted chemical etching forms electrically isolated through-silicon conductive structures from an electrically conductive silicon substrate. FIG. 7(*a*) shows an electrically conductive silicon substrate 100. In this embodiment, noble metal structures 140, shown in FIG. 7(*b*) catalyze directional etching from a first surface of the substrate. The etch progresses toward the second surface of the substrate, thereby forming trenches or recess features 700 in the substrate, as shown in FIG. 7(*c*), but in this embodiment, the etch front does not reach the second or bottom surface 120. In this embodiment, the etching process is arrested by removing the substrate from the aqueous etching chemistry before the etch front reaches the bottom surface 120. FIG. 7(*d*) shows the application of a conformal dielectric material that fills the trenches. In some embodiments the dielectric material is a polymer or other material that may be applied as a liquid, for example, benzocyclobutene (BCB), polyimide, epoxy, polybenzoxazole (PBO), or spin-on glass (SOG). In some embodiments the dielectric material is applied by chemical vapor deposition. In some embodiments the dielectric material includes a thermal silicon oxide. In some embodiments, the dielectric includes two of more of the following: thermal silicon oxide, a dielectric applied by chemical vapor deposition, and a material applied as a liquid prior to curing. Liquid dielectric materials in these embodiments are cured after their application to form solid dielectrics. FIG. 7(*e*) shows the removal of a portion of the silicon substrate including the bottom surface 120 and a portion of the substrate in close proximity to the bottom surface 120, with the amount removed indicated by arrow 720 of FIG. 7(*d*), such that the noble metal structures 140 are also removed and a new, third surface 122 of the silicon substrate opposite the first or support surface 110 is exposed. The removal may be accomplished by back-grinding or by etching, for example. In this way, an embodiment of the present invention produces electrically isolated structures 730 of conductive silicon that extend from the support surface 110 to the third surface 122. The electrically isolated structures 730 of conductive silicon are electrically isolated from each other by the remaining dielectric materials 710. FIG. 7(*e*) also shows the removal of at least a portion of the dielectric material 710 from the first surface 110 of the substrate to expose at least a portion of the electrically isolated structures of conductive silicon.

Figure 8:
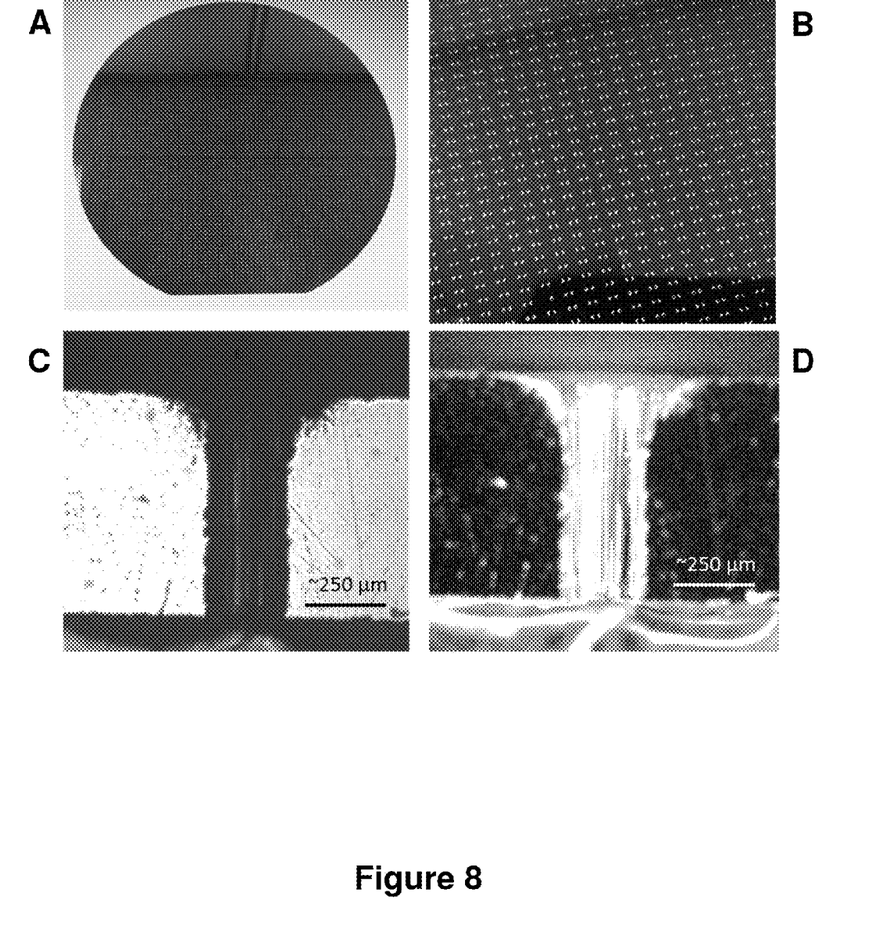
FIG. 8. Examples of through-silicon vias formed by metal assisted chemical etching. A is a photograph of a 150 mm diameter silicon substrate after via formation. B is a closer up view to better illustrate the position and sizes of the vias. C and D are micrographs of a cross section of the through silicon via in bright and dark-field, respectively.

FIG. 8 shows photographs of through silicon vias of the present invention formed by the methods of the present invention, using gold structures applied to the first surface of a silicon substrate by evaporation through a shadow mask followed by immersion of the substrate into an aqueous mixture of hydrogen peroxide and hydrofluoric acid. FIG. 8A shows a photograph of the 150 mm diameter substrate after formation of the vias. FIG. 8B shows another photograph of the same substrate after formation of the vias, highlighting the positions and sizes of the vias. FIGS. 8C and 8D show micrographs of a cross sectioned through silicon via of the present invention formed by the methods of the present invention in bright-field (FIG. 8C) and dark field (FIG. 8D).

The present invention has been described above with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In no event, however, should "on" or "directly on" be construed as requiring a layer to cover an underlying layer.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top" or "support" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation. The following claim is provided to ensure that the present application meets all statutory requirements as a priority application in all jurisdictions and shall not be construed as setting forth the scope of the present invention.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. Specific names of compounds are intended to be exemplary, as it is known that one of ordinary skill in the art can name the same compounds differently. Every formulation or combination of components described or exemplified herein can be used to practice the invention, unless otherwise stated.

Whenever a range is given in the specification, for example, a size range, a concentration range, a parameter range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, synthetic methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for making a through-silicon via feature in a silicon substrate, the method comprising the steps of:
    providing a silicon substrate having a support surface and a bottom surface separated from the support surface by a silicon substrate thickness;
    forming a noble metal structure on the silicon substrate support surface to generate silicon substrate contact regions that are in contact with or proximate to the noble metal structure, and silicon substrate non-contact regions that are not in contact with or are not proximate to the noble metal structure;
    exposing at least a portion of the silicon substrate support surface and noble metal structure to an etchant, wherein the etchant is an aqueous solution that comprises an oxidizing agent and an acid;
    preferentially etching with the etchant the silicon substrate contact regions compared to silicon substrate non-contact regions, wherein the preferentially etching provides an etch front having an etch front rate and etch front direction, the etch front direction substantially normal to the silicon substrate support surface;
    continuing the preferentially etching step until the etch front reaches the silicon substrate bottom surface;
    exposing the through-silicon via to an aqueous acid mixture to remove any remnant noble metals from the silicon substrate;
    forming an electrically insulating layer on at least a portion of a surface of the silicon substrate and a wall of the through-silicon via;
    providing a plating base on at least a portion of the surface of the silicon substrate having a through-silicon via;
    depositing metal on at least a portion of a surface of the plating base, wherein the depositing metal step comprises electrodeposition of the metal on the surface of the plating base to form plated metal structures; and
    electrically isolating separate electrical nodes on the surfaces the silicon substrate by removing the plating base from the deposited metal and the silicon substrate;
    thereby forming the through-silicon via by metal-catalyzed wet etching and a silicon interposer wafer-level package.

2. The method of claim 1, wherein the exposing step comprises submerging at least a portion of the silicon substrate and noble metal structure into the etchant.

3. The method of claim 1, wherein the etch front direction is substantially parallel to a gravitational force direction.

4. The method of claim 1, wherein the aqueous acid mixture is selected from the group consisting of: hydrochloric acid and nitric acid; and iodine and potassium iodide.

5. The method of claim 4, wherein the electrically insulating layer forming step is by a process that is thermal oxidation or chemical vapor deposition.

6. The method of claim 5, wherein:
    the plating base comprises a metal selected from the group consisting of: copper, tungsten, titanium, palladium, platinum, and nickel; and
    the plated metal structures comprise a metal selected from the group consisting of: copper, gold, silver, nickel, and platinum.

7. The method of claim 1, further comprising etching the silicon substrate and through vias with an isotropic etchant, thereby removing remnants of any silicon in the vias, wherein the isotropic etchant comprises mixtures of nitric acid and hydrofluoric acid; or nitric acid and ammonium fluoride, wherein the isotropic etchant etching step improves a through-silicon via parameter, the through silicon via parameter selected from the group consisting of through-silicon via wall roughness and silicon remnant amount in the through-silicon vias.

8. The method of claim 1, further comprising:
    thermally oxidizing at least a portion of the silicon substrate and through-silicon vias thereby forming an oxide of silicon; and
    stripping said oxide of silicon using an aqueous solution that comprises hydrofluoric acid.

9. The method of claim 1, wherein the preferential etching corresponds to a silicon substrate contact region maximum etch front rate that is at least 100-fold greater than a non-contact region minimum etch front rate.

10. The method of claim 1, wherein the noble metal structure comprises a plurality of noble metal structures formed on the silicon substrate support surface in a pattern, wherein said noble metal structures are formed by a process selected from the group consisting of: evaporation deposition through a shadow mask; photolithography; metal deposition; and lift-off.

11. The method of claim 1, wherein the noble metal of the noble metal structure comprises a metal selected from the group consisting of: gold, platinum and silver.

12. The method of claim 10, wherein each of said plurality of noble metal structures are substantially spherical, wherein each substantially spherical noble metal is confined to a position with a template structure having a plurality of recess features, with each recess feature confining a substantially spherical noble metal; wherein:
    said template structure is a photoresist;
    said substantially spherical noble metal structure is selected from the group consisting of: a solid noble metal; a polymer bead coated with a noble metal; and a non-noble metal ball coated with a noble metal; and
    said substantially spherical noble metal structure has an average diameter that is greater than or equal to 25 µm and less than or equal to 250 µm.

13. The method of claim 1, further comprising: controlling the etch front rate or etch front direction by selecting a geometrical shape and pattern of the noble metal structure, wherein the geometrical shape and pattern comprises a noble metal structure having a substantially circular outer limit and a spatially-varying pattern of noble metal particles within an interior region defined by the substantially circular outer limit and the spatially-varying pattern corresponds to a grid, a ring, or a plurality of lines or curves extending from an origin.

14. The method of claim 1, wherein the through-silicon via has a characteristic opening size that is greater than or equal to 25 µm and less than or equal to 500 µm; and having a plurality of through-silicon vias with a through-silicon via density that is between about 0.1 mm$^{-2}$ and 1000 mm$^{-2}$.

15. The method of claim 1, wherein the etchant aqueous solution comprises a mixture of hydrogen peroxide and hydrofluoric acid.

16. The method of claim 1, wherein the silicon substrate is selected from the group consisting of: monocrystalline silicon; solar grade silicon; multi-crystalline silicon; and polycrystalline silicon.

17. The method of claim 1, wherein the through-silicon via has a smooth wall surface.

18. A method for making a wafer-level silicon interposer package, the method comprising the steps of:
   providing a silicon substrate having a support surface and a bottom surface separated from the support surface by a silicon substrate thickness;
   forming a noble metal structure on the silicon substrate support surface to generate silicon substrate contact regions that are in contact with or proximate to the noble metal structure, and silicon substrate non-contact regions that are not in contact with or are not proximate to the noble metal structure;
   exposing at least a portion of the silicon substrate support surface and noble metal structure to an etchant, wherein the etchant is an aqueous solution that comprises an oxidizing agent and an acid;
   preferentially etching with the etchant the silicon substrate contact regions compared to silicon substrate non-contact regions, wherein the preferentially etching provides an etch front having an etch front rate and etch front direction, the etch front direction substantially normal to the silicon substrate support surface; and
   continuing the preferentially etching step until the etch front reaches the silicon substrate bottom surface;
   exposing the through-silicon via to an aqueous acid mixture to remove any remnant noble metals from the silicon substrate;
   electrically insulating at least a portion of the silicon substrate and a wall of the through-silicon via;
   contacting the silicon substrate to a cathode configured for electroplating, wherein the cathode comprises a titanium layer having a plating base surface and electrically insulating spacer features;
   plating a metal on the plating base surface, wherein the plating the metal step comprises at least partially filling the through-silicon via with the metal and laterally wrapping a portion of the silicon substrate support surface with the metal; and
   separating the cathode from the silicon substrate, wherein the plated metal that at least partially fills the through-silicon via remains in the through-silicon via.

\* \* \* \* \*